United States Patent
Lamalle (10) Patent No.: US 10,120,051 B2
(45) Date of Patent: Nov. 6, 2018

(54) METHOD FOR ESTIMATING A CONVOLUTION PRODUCT

(71) Applicant: UNIVERSITE GRENOBLE ALPES, Saint Martin d'heres (FR)

(72) Inventor: Laurent Lamalle, Grenoble (FR)

(73) Assignee: UNIVERSITE GRENOBLE ALPES, Saint Martin d'heres (FR)

( * ) Notice: Subject to any disclaimer, the term of this patent is extended or adjusted under 35 U.S.C. 154(b) by 32 days.

(21) Appl. No.: 15/339,733

(22) Filed: Oct. 31, 2016

(65) Prior Publication Data

US 2017/0146626 A1   May 25, 2017

(30) Foreign Application Priority Data

Oct. 29, 2015   (FR) ...................................... 15 60391

(51) Int. Cl.
| | | |
|---|---|---|
| *G06K 9/00* | (2006.01) | |
| *G01R 33/56* | (2006.01) | |
| *G01R 33/48* | (2006.01) | |
| *G06T 7/00* | (2017.01) | |
| *G06T 5/20* | (2006.01) | |
| *G06T 11/00* | (2006.01) | |

(52) U.S. Cl.
CPC ........... *G01R 33/56* (2013.01); *G01R 33/482* (2013.01); *G06T 5/20* (2013.01); *G06T 7/0012* (2013.01); *G06T 11/006* (2013.01); *G06T 2207/10088* (2013.01); *G06T 2207/30016* (2013.01)

(58) Field of Classification Search
CPC ..... G01R 33/482; G01R 33/56; G06T 11/006; G06T 2207/10088; G06T 2207/30016; G06T 5/20; G06T 7/0012
See application file for complete search history.

(56) References Cited

PUBLICATIONS

Rasche et al., "Resampling of Data Between Arbitrary Grids Using Convolution Interpolation"; IEEE Transactions on Medical Imaging, IEEE Service Center, Piscataway, NJ, US; vol. 1, No. 5; May 1, 1999, XP011035860, ISSN: 0278-0062.

Schomberg et al., "The Gridding Method for Image Reconstruction by Fourier Transformation"; IEEE Transactions on Medical Imaging, IEEE Service Center, Piscataway, NJ,US; vol. 14, No. 3, Sep. 1, 1995; pp. 596-607, XP000527221; ISSN: 0278-0062, DOI: 10.1109/42.414625.

Search Report dated Sep. 21, 2016 in French Application No. 1560391, filed Oct. 29, 2015.

*Primary Examiner* — Nirav G Patel
(74) *Attorney, Agent, or Firm* — Oblon, McClelland, Maier & Neustadt, L.L.P.

(57) ABSTRACT

The invention is a method for estimating a product of convolution of a measurement function, representing measurements, defined according to first coordinates, with a convolution kernel.

The convolution product is estimated at second coordinates, different from said first coordinates. The measurement function represents measurements performed on the basis of a detector, in particular a detector of physical quantities. An exemplary application of the method relates to Magnetic Resonance Imaging, the method allowing a redistributing of measured data, not uniformly distributed, according to a uniform mesh, prior to the application of a fast Fourier transform algorithm.

17 Claims, 8 Drawing Sheets

METHOD FOR ESTIMATING A CONVOLUTION PRODUCT

TECHNICAL FIELD

The technical field of the invention is the processing of data measured by a measurement device. More precisely, the invention relates to a method for interpolating a function representing measurements arising from a detector. One of the envisaged applications is a distributing, according to a uniform mesh, of measured data prior to carrying out a fast Fourier transform.

PRIOR ART

Recourse to a fast Fourier transform is commonly used to transform data, defined in a spatial or temporal domain, to a frequency domain, and vice versa.

For example, in the field of Magnetic Resonance Imaging (MRI), measurements are acquired, in the form of radio-frequency data sampled in a starting space, akin to the domain of spatial frequencies, this space being designated by the term space k. The measurements are sampled according to coordinates $r_i = (k_{x,i}, k_{y,i})$ in this space k. In the course of an acquisition, a magnetic field is applied to an examined object, the gradient of this magnetic field, called the spatial encoding magnetic field gradient, being modulated. The coordinate $r_i$ of each measurement, sampled in the space k, corresponds to the integral, over time, of the spatial encoding magnetic field gradient applied to the examined object. This coordinate is multidimensional, and is generally expressed according to two or three dimensions in the space k. The measurements correspond to an electromagnetic signal, generally in the radiofrequency domain, measured by an antenna and representative of a spatial distribution of the nuclear magnetization in the examined object. To obtain directly utilizable information, a multidimensional, for example 2D, Fourier transform is applied to the measurements, sampled in the space k, so as to obtain an image I of the examined object, in a so-called arrival space, representing the spatial domain, sometimes called the direct space. The image I is such that $$I(x) = \int_r f(r) e^{i2\pi x r} dr \approx \sum_{r_i} f(r_i) e^{i2\pi x r_i} \delta r_i$$

Where:
x designates a multidimensional coordinate in the arrival space, r designates a multidimensional coordinate in the space k, $f(r_i)$ designates a measurement sampled at the coordinate $r_i$ in the space k and $\delta r_i$ represents an elementary area associated with said coordinate $r_i$. This image I represents a distribution of the nuclear magnetization in the examined object. In this text, the symbol $\approx$ signifies "being approximated by".

Usually, this Fourier transform is carried out by implementing a fast Fourier transform algorithm, better known by the acronym FFT (Fast Fourier Transform). However, recourse to such an algorithm assumes that the coordinates, in the starting space, are distributed in a regular manner, defining a uniform Cartesian grid. This condition is not necessarily fulfilled, in particular when measurements are sampled, in the space k, according to coordinates $r_i$ distributed in a pseudo-random manner or following a particular trajectory, for example radial, or spiral, while being distributed irregularly along this trajectory. Because of the non-uniform distribution of the measurements in the space k, it is not possible to use a fast Fourier transform algorithm directly. It is necessary to redistribute the measurements according to a uniform Cartesian grid.

A simple interpolation of the measurements on the basis of their near neighbors does not give a satisfactory result. Hence, it is commonplace to redistribute, according to said uniform Cartesian grid, not the measurements $f(r_i)$, but a product of convolution of these measurements with a convolution kernel g, the latter being defined according to a finite support $\Omega$. The convolution product is computed at each point $u_j$ of the uniform Cartesian grid. A convolution kernel commonly used is the Kaiser-Bessel function, or else a truncated sinc function. The effect of the convolution kernel is compensated, after Fourier transform, by a "de-apodization", consisting in a division by a Fourier transform of the convolution kernel. The convolution and de-apodization steps are commonly designated by the term "gridding". Such a convolution product can be determined by applying the following equation:

$$f * g(u_j) = \sum_{r_i \in \Omega_j} f(r_i) g(u_j - r_i) \tag{1}$$

where:
- $r_i$ designates first coordinates, distributed in a non-uniform manner in the space k, for example along a trajectory describing a spiral;
- $u_j$ designates second coordinates (or interpolation coordinates) constituting the uniform Cartesian grid, in said space k;
- $\Omega_j$ designates the support of the convolution kernel (convolution support) centered at $u_j$.

During the computation of the convolution product, the measured data $f(r_i)$ are corrected by a function c, called the sampling density, intended to compensate the non-uniform distribution of the coordinates $r_i$ of the measurements. This function c can be determined either analytically, or by way of a geometric meshing of the space k, for example a Voronoï meshing. A weighting factor, representing the sampling density, is then applied to each term of the convolution product, according to the expression:

$$f * g(u_j) = \sum_{r_i \in \Omega_j} \frac{f(r_i) g(u_j - r_i)}{c(r_i)}. \tag{1'}$$

The value of the function $c(r_i)$ at each coordinate $r_i$ depends on the sampling density around this coordinate, or sample, $r_i$. The higher it is, the denser the sampling. In the case where the space k is meshed according to a Voronoï mesh, if $\delta(r_i)$ describes the area of a Voronoï cell corresponding to the coordinate $$r_i, \frac{1}{c(r_i)} \approx \delta(r_i).$$

Such a convolution product is then computed at each coordinate $u_j$ of the uniform Cartesian grid. By applying a fast Fourier transform to it, one obtains an image of the object examined in the direct space. As described previously, this Fourier transform is de-apodized by the Fourier transform of the convolution kernel.

Equation (1') is usually implemented in gridding algorithms used. For example, the publication Rasche V, "Resampling of data between arbitrary grids using convolution interpolation", IEEE transactions on medical imaging, Vol. 18, No. 5, May 1999, uses such a convolution product to redistribute values of a measurement function according to a regular mesh.

It is admitted that the size of the support of the convolution kernel must be reduced, so as to limit the computation time, while being sufficiently extensive to limit the reconstruction artifacts. Hence, the support of the convolution kernel generally extends, along each dimension of the starting space, along 1 to 10 intervals associated with the coordinates of the uniform mesh. Interval is understood to mean a spacing between two adjacent coordinates, along a dimension of the starting space.

The convolution is carried out by performing a single prior meshing of the space k, for example a Voronoï meshing, from which the sampling density $c(r_i)$ is determined at each measurement point $r_i$. Stated otherwise, to each measurement point $r_i$ there corresponds a sampling density value which is used whatever the interpolation coordinate $u_j$.

The inventor has noted that such a protocol could induce noise, called reconstruction noise, affecting the image obtained in the direct space. The invention proposes a method for determining a product of convolution of a function, representing a measurement, with a convolution kernel, for example prior to a Fourier transform, making it possible to improve the quality of the reconstructed images. Moreover, this method makes it possible, in certain cases, to increase the speed of processing of the measured data.

DISCLOSURE OF THE INVENTION

A subject of the invention is a method for estimating a product of convolution of a measurement function with a convolution kernel, said measurement function being representative of measurements acquired by a detector, and defined in a starting space, according to first coordinates, notably discrete, the method being aimed at estimating a value of said convolution product at second coordinates, notably discrete, of said starting space, the convolution kernel being defined on a finite support, called the convolution support (or interpolation support), in said starting space; the method comprising an acquisition of measurements by a detector and the establishment of the measurement function, the method comprising, for each second coordinate, the following steps:
  a) on the basis of the convolution support, definition of a so-called centered convolution support (or centered interpolation support), associated with said second coordinate, in such a way that said second coordinate constitutes the center of said centered convolution support;
  b) definition of a mesh in said centered convolution support, so as to associate a surface element with each first coordinate included in said centered convolution support;
  c) determination of a weighting factor associated with each first coordinate included in said centered convolution support, the latter being associated with said second coordinate;
  d) computation of a product of convolution of said measurement function with said kernel on said centered convolution support, by weighting a value of the measurement function, at each first coordinate included in said centered convolution support, with the weighting factor associated with said first coordinate, determined during step c);
  e) estimation of a value of a convolution product at said second coordinate as a function of the computation carried out during step d);
steps a) to e) being implemented, for each second coordinate, by at least one microprocessor, the method being characterized in that during step b) the mesh is defined such that each surface element is contained in said centered convolution support, associated with said second coordinate.

Thus, at least two surface elements, associated with one and the same first coordinate, and with two distinct second coordinates, are different from one another.

It will be noted that, in contradistinction to the prior art, the method comprises a definition of the mesh, specific to each centered elementary support. Consequently, during the computation of the convolution product in terms of two different second coordinates, the weighting factor associated with one and the same first coordinate can vary, as a function of the second coordinate considered. This constitutes a noticeable difference in regard to the prior art.

By function representative of measurements is meant a function established on the basis of measurements arising from a detector, these measurements being able to form the subject of a prior processing, for example a convolution, or a change of space by application of an operator of Fourier transform type.

By convolution product is meant a discrete convolution product, the convolution kernel being able to be a continuous function.

According to one embodiment, during step d), the convolution product comprises a sum of the products:
  of a value of the measurement function at a first coordinate;
  of a value of the convolution kernel at said first coordinate referenced to the second coordinate;
  of the weighting factor determined during step c), the latter being associated with said first coordinate and with said second coordinate;
said products being computed for each first coordinate included in the centered convolution support associated with a second coordinate.

By first coordinate referenced to the second coordinate is meant a difference of the second coordinate and of the first coordinate.

According to one embodiment, the method can comprise, prior to steps a) to e), the establishment of an initial mesh of the starting space, so as to associate with each first coordinate an initial surface element, in such a way that in at least one step b), each surface element associated with a first coordinate is determined by truncating said initial mesh by said centered convolution support, so that each initial surface element extending beyond said centered convolution support is modified in such a way as to be delimited by said centered convolution support.

According to one embodiment, during step b) the meshing of said centered convolution support is carried out in such a way that at least one surface element, or indeed each surface element, is defined independently of any initial mesh. Stated otherwise, the meshing of a centered support, associated with a second coordinate, is carried out independently of the meshing of another centered support, associated with another second coordinate. Preferably, the meshing of each centered convolution support is carried out independently of the meshing of the other centered convolution supports. Step b) can then comprise:

a determination, in each centered convolution support, of first so-called particular coordinates at which the convolution kernel takes a particular value, for example a zero value;

a definition of so-called particular surface elements associated with these first particular coordinates.

The method can comprise one of the following characteristics, taken individually or according to the technically realizable combinations:

During step c), the weighting factor associated with each first coordinate is determined by computing an area of the surface element associated with said first coordinate, defined during step b).

During step c), the weighting factor associated with each first coordinate is determined by computing an integral of the convolution kernel over the surface element associated with said first coordinate, defined during step b).

During step c), each centered convolution support is subdivided into a plurality of elementary surfaces, the computation of the weighting factor, associated with each first coordinate, comprising a sum of the elementary surfaces included in the surface element associated with said first coordinate, said sum being optionally weighted by a value of said convolution kernel in each of said elementary surfaces. In this case, the number of elementary surfaces in a centered convolution support can be determined as a function of the number of first coordinates included in said centered convolution support, of the distance between two first adjacent coordinates belonging to said centered convolution support, or of the evolution of the convolution kernel in said centered convolution support.

Each second coordinate defines a uniform mesh of the starting space.

The starting space is a space defined in the frequency, spatial or temporal domain, or their combination.

The microprocessor comprises a plurality of elementary microprocessors, steps a) to e) being implemented simultaneously by various elementary microprocessors, each elementary microprocessor performing steps a) to e) for one or more second coordinates.

The convolution kernel is a symmetric function with respect to the center of its support and/or a function whose value is at a maximum at the center of its support.

The measurements arise from a magnetic resonance imaging detector. This entails notably measurements of an electromagnetic signal, in the radio-frequency spectral domain.

Another subject of the invention is an information recording medium, comprising instructions for the execution of a method such as described in the patent application, these instructions being able to be executed by a microprocessor.

Another subject of the invention is a method for estimating a Fourier transform of a measurements function, representative of measurements acquired by a detector, and defined in a starting space, according to first discrete coordinates, said method comprising:

an estimation of a product of convolution of said measurement function with a convolution kernel, such as described above, the convolution product being estimated at a plurality of second coordinates, notably discrete, disposed according to a mesh, for example uniform, of a starting space, the application of a fast Fourier transform to said estimated convolution product at said second coordinates.

The Fourier transform thus estimated is defined in an arrival space. This method can comprise a step of normalizing said Fourier transform by a Fourier transform of the convolution kernel.

The term Fourier transform, unless indicated otherwise, designates a direct or inverse Fourier transform. The same holds for the fast Fourier transform, which designates either a direct or inverse transform.

By uniform mesh is meant a regular mesh of a space, each mesh cell interval along the various coordinate axes being a constant specific to each axis. Stated otherwise, the distance, along an axis, between two adjacent coordinates, is constant.

The invention will be better understood in the exemplary embodiments described hereinafter, in conjunction with the following figures.

FIGURES

FIGS. 5F, 5G, 5H and 5I are results arising from a third example, by implementing a method according to the invention.

DISCLOSURE OF PARTICULAR EMBODIMENTS

Figure 1A:
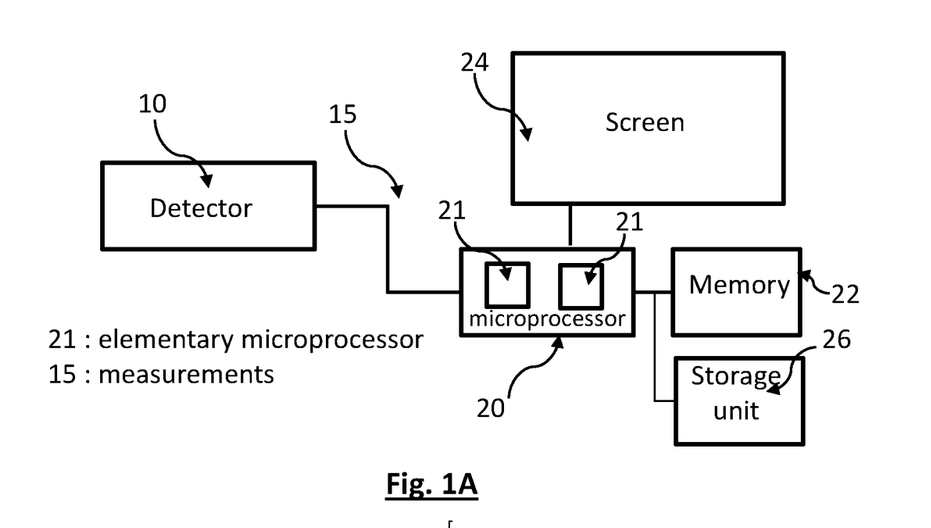
FIG. 1A represents a detector able to acquire measurements that can be processed according to the invention.
Figure 1B:
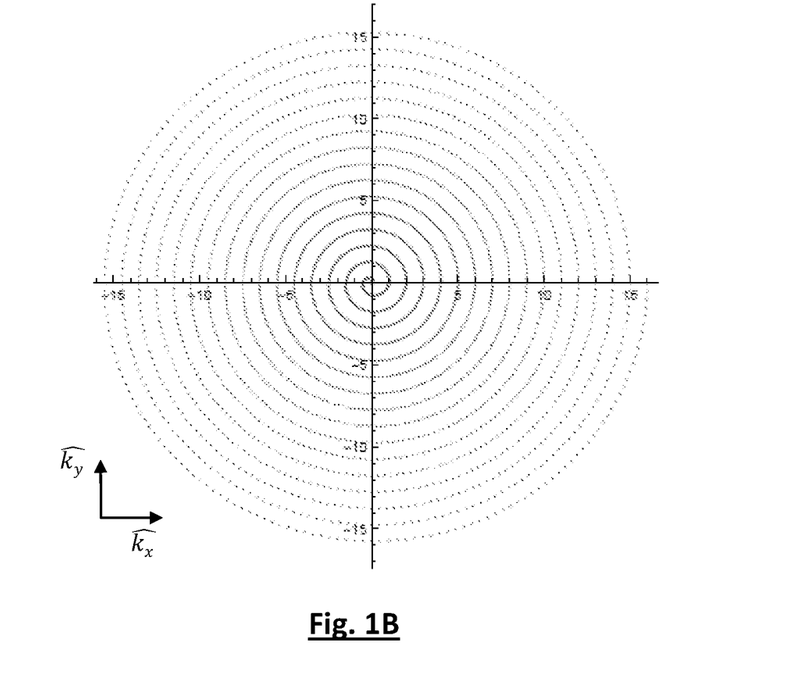
FIG. 1B represents a distribution of the measurements, according to a spiral in a space of spatial frequencies, called the space k.

FIG. 1A represents a detector 10 able to acquire measurements 15, so as to form a measurement function $f$ representative of these measurements. The measurements 15 are transmitted to a processing unit, such as a microprocessor 20. These measurements correspond to measured physical quantities, for example values of an electromagnetic field, of a magnetic field, of an electronic, acoustic, optical signal, this list not being limiting. The microprocessor is linked to a memory 22, able to store instructions allowing the implementation, by said microprocessor, of the method described hereinafter, in conjunction with FIGS. 2 and 3A to 3G. In the embodiments described hereinafter, the detector is an antenna of a device of MRI type, mentioned in conjunction with the prior art, able to measure a radio-frequency signal emitted by an object subjected to a magnetic field gradient. FIG. 1B illustrates a trajectory, in the form of a spiral, described in conjunction with the prior art, in a space of spatial frequencies, called the space k. The points correspond to coordinates according to which the measurements are sampled. These sampled measurements are distributed in a non-uniform manner in the space k. The axes of this figure represent the spatial frequencies $k_x$, $k_y$ respectively according to two basis vectors $\vec{k_x}$ and $\vec{k_y}$ of the direct space.

Figure 2:
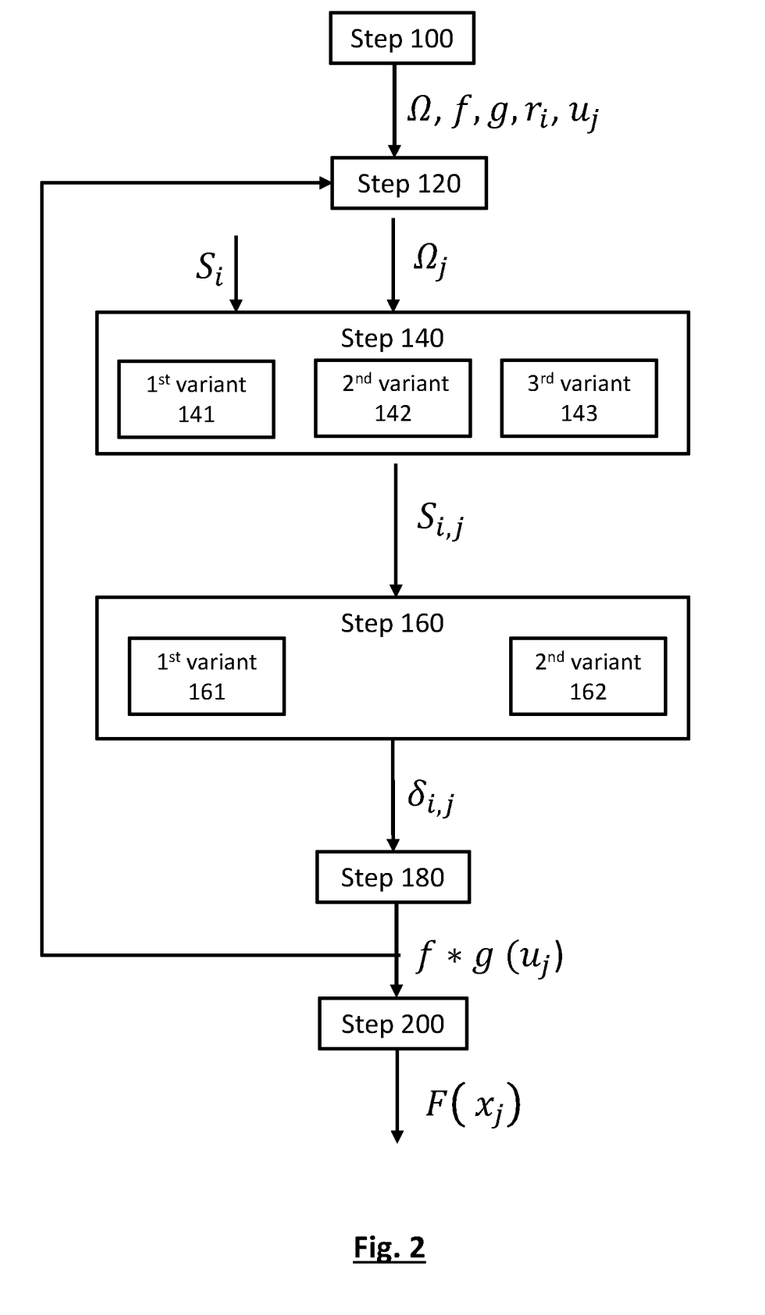
FIG. 2 represents the main steps of a method according to the invention.

FIG. 2 describes the main steps of a method according to the invention. According to this method, measured data are available, distributed discretely in a space, called the starting space, according to first coordinates. This example involves measurements carried out by a magnetic resonance imaging (MRI) modality, these data being conventionally represented in a frequency space, called the space k, spanned by two basis vectors $\vec{k_x}$ and $\vec{k_y}$.

Figure 3A:
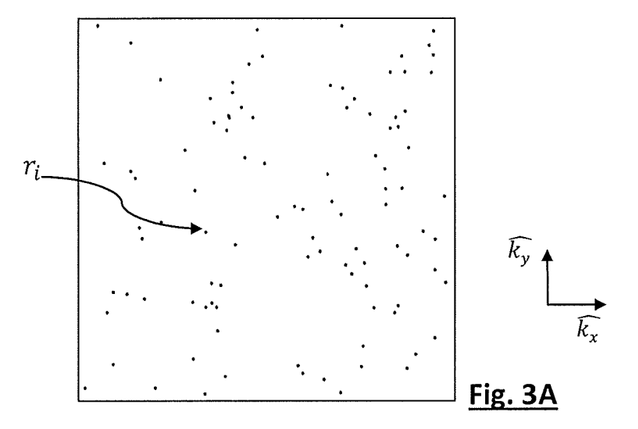
FIG. 3A represents measurement points, or first coordinates, distributed according to a non-uniform distribution, in said space k.
Figure 3B:
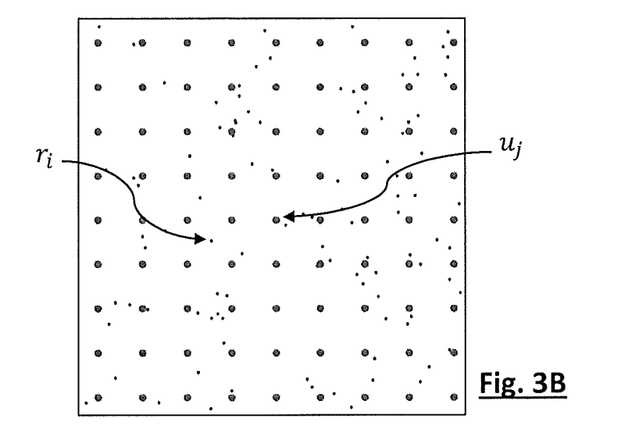
FIG. 3B represents said first coordinates, non-uniformly distributed, as well as second coordinates, defining a Cartesian grid.

In FIG. 3A, the black points $r_i$ represent such first coordinates, and measurements $f(r_i)$ are available at each first coordinate $r_i = (k_{x,i}; k_{y,i})$. These first coordinates are not distributed according to a uniform mesh. In the example represented in FIG. 3A, these first coordinates are distributed in a random manner in the starting space. The two basis vectors $\vec{k_x}$ and $\vec{k_y}$ of this starting space have been represented in this figure. As mentioned in conjunction with the prior art, these measurements can be represented in a second space, called the arrival space, or direct space. The switch from the starting space, i.e. the frequency space, to the direct space can be carried out by applying a fast Fourier transform to the data measured in the frequency space. But this makes it necessary to have a distribution, in this space, of data according to a uniform mesh. A uniform mesh, or uniform Cartesian grid, such as this, corresponds to second coordinates $u_j$, represented in FIG. 3B, alongside the first coordinates n. The interval of such a mesh designates a distance between two second adjacent coordinates aligned along a basis vector of the starting space.

One then seeks to determine, at each second coordinate $u_j$, a product of convolution of the measurement function $f$ with a convolution kernel g, so as to obtain regularly spaced data. As described in conjunction with the prior art, the convolution kernel g is determined on a support $\Omega$. The convolution kernel is preferably at a maximum at the center of the support, and it is preferably symmetric. It may typically be the Kaiser-Bessel function but other functions commonly used for "low-pass" filtering are possible, such as a function of truncated sinc type or a prolate spheroidal function of order 0, or the combination of such functions. The convolution kernel can be a separable function, that is to say its value at a point corresponds to the product of the values of a one-dimensional function in each coordinate of this point.

At each second coordinate $u_j$, the convolution product can be expressed in the form:

$$f*g(u_j) = \sum_{r_i \in \Omega_j} f(r_i) g(u_j - r_i) \partial_{i,j} \quad (2)$$

where $\Omega_j$ designates the support of the convolution kernel (or convolution support) centered at $u_j$ and $\partial_{i,j}$ designates a weighting term dependent on the first coordinate $r_i$ and on the second coordinate $u_j$.

According to the prior art, to each first coordinate $r_i$ is allocated a sampling density $c(r_i)$, and at each second coordinate $u_j$, the following convolution product is performed:

$$f*g(u_j) = \sum_{r_i \in \Omega_j} f(r_i) g(u_j - r_i) \frac{1}{c(r_i)}, \quad (1)'$$

the term $$\frac{1}{c(r_i)}$$

corresponding also to a weighting term, called the sampling density, described in conjunction with the prior art.

The inventor has considered that it was more relevant to use as a basis an assumption according to which at each second coordinate $u_j$, the convolution product comprises a weighting term, denoted $\partial_{i,j}$, varying not only as a function of the first coordinate $r_i$, but also as a function of the second coordinate $u_j$. The well-foundedness of this assumption will be justified in the following paragraphs.

Figure 3C:
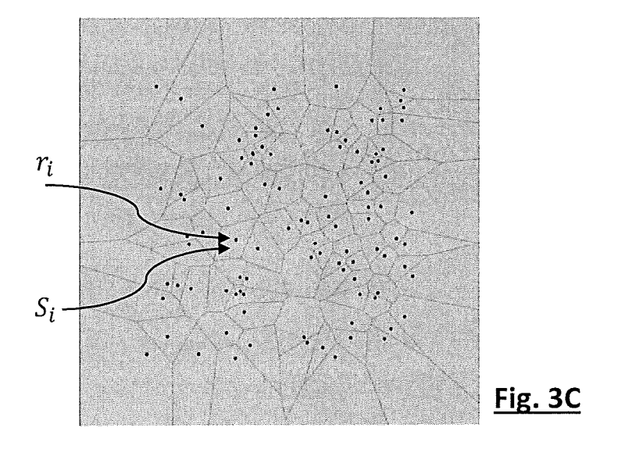
FIG. 3C represents a Vorondï meshing carried out according to the distribution presented in FIG. 3A.

FIG. 3C represents the application of a Voronoï mesh to the starting space. It is on this basis that it is possible to determine, according to the prior art, the sampling density associated with each first coordinate $r_i$, with $$\frac{1}{c(r_i)} = \delta(r_i),$$

where $\delta(r_i)$ describes the area of a mesh cell, or surface element $S_i$, associated with the coordinate $r_i$.

Figure 3D:
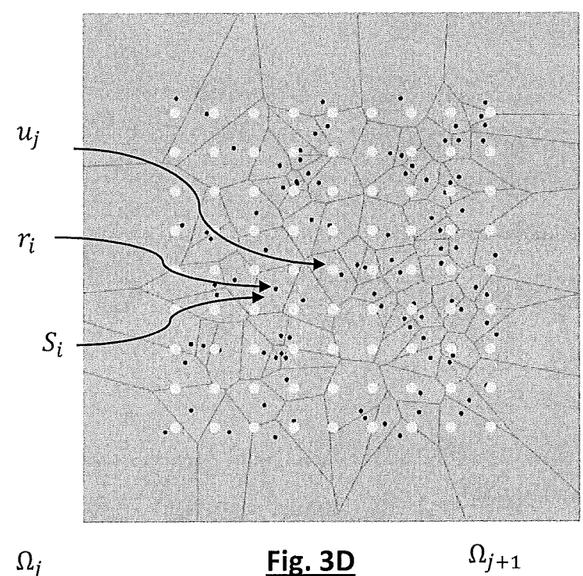
FIG. 3D represents the mesh illustrated in FIG. 3C, on which the previously mentioned uniform Cartesian grid appears.

FIG. 3D represents the first space meshed according to a Voronoï mesh, such as represented in FIG. 3C, and on which the first coordinates $r_i$ and the second coordinates $u_j$ appear.

Figure 3E:
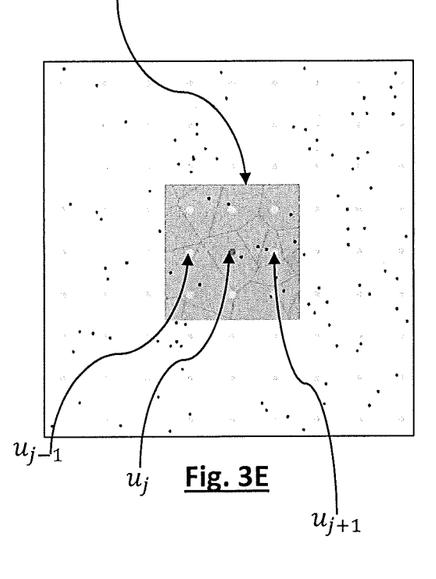
FIGS. 3E and 3F represent a convolution support centered according to two second neighboring coordinates of the Cartesian grid.
Figure 3F:
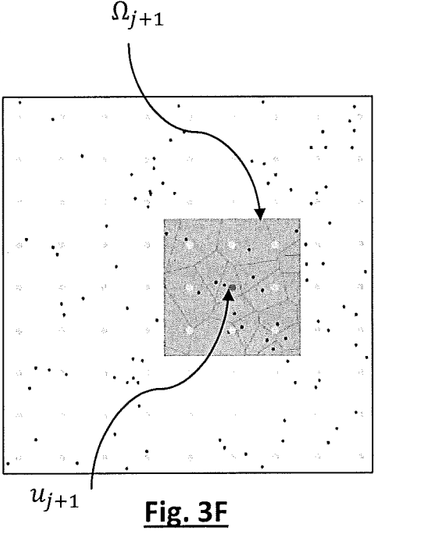
Figure 3G:
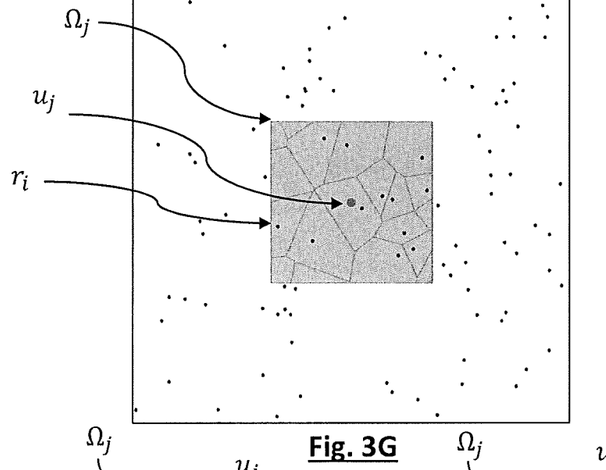
FIG. 3G represents a convolution support centered on a second coordinate of the Cartesian grid.

It is assumed, in this figure, that the support $\Omega$ of the convolution kernel g extends over three intervals separating second coordinates $u_j$, along each basis vector of the starting space. FIGS. 3E and 3F represent the centered supports of the convolution kernel of the convolution kernels, denoted $\Omega_j$ and $\Omega_{j+1}$, respectively associated with second neighboring coordinates $u_j$ and $u_{j+1}$. For easier reading, FIG. 3G corresponds to FIG. 3E, without representing the second coordinates $u_{j-1}$, and $u_{j+1}$ adjacent to the second coordinate $u_j$.

The method comprises a first step 100 of defining the input data, in particular:
  the first coordinates $r_i$, defined in this example in a non-uniform manner, and the values $f(r_i)$ of a measurement function at each of these first coordinates. In this example, the measurement function results from a system for acquiring measurements by MRI, in the space k.
  the second coordinates $u_j$, with $1 \le j \le J$, j being a natural integer and J designating the number of second coordinates to be considered.

the convolution kernel g and its support Ω, finite in the starting space.

Knowing the first coordinates $r_i$, the second coordinates $u_j$ as well as the support Ω, the following step 120 of the method amounts to centering the support Ω according to a second coordinate, the support thus centered being denoted $\Omega_j$ and designated by the term convolution support centered at $u_j$.

The method thereafter comprises a step 140, comprising the allocating of a surface element, denoted $S_{i,j}$, to each first coordinate $r_i$ of the support $\Omega_j$ centered on said second coordinate $u_j$. Several variants can be considered.

According to a first variant 141, a mesh of the starting space produced previously, called the initial mesh, for example the Vorondï mesh represented in FIGS. 3C and 3D, is exploited. This initial mesh makes it possible to allocate, to each first coordinate an initial surface element $S_i$. As may be seen in FIG. 3H, this mesh is truncated by the convolution support $\Omega_j$ centered on the second coordinate $u_j$. Each initial surface element $S_i$ extending beyond the support $\Omega_j$ is cut off and delimited by the peripheral boundary of the support $\Omega_j$. An initial surface element $S_i$ associated with a first coordinate $r_i$, and thus truncated, has been represented in FIG. 3H. The dashed lines correspond to the initial limits of this initial surface element $S_i$, such as represented in FIG. 3C. Truncating the initial mesh of the starting space amounts to reconfiguring this mesh, by affixing new limits to any initial surface element $S_i$ extending beyond the support $\Omega_j$, these new limits being the boundaries of the support. This amounts to obtaining a surface element $S_{i,j}$ different from the initial surface element $S_i$.

Figure 3H:
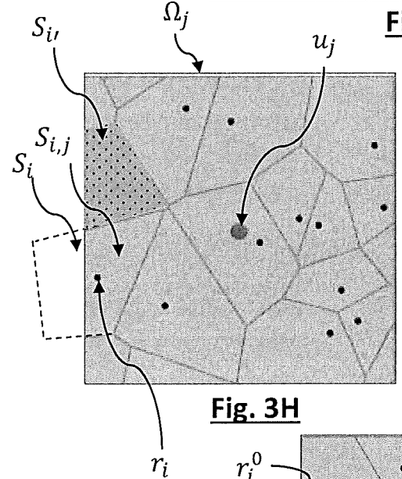
FIGS. 3H, 3I and 3J illustrate three different possibilities of defining a mesh of the elementary convolution support represented in FIG. 3G. These figures represent respectively a first variant, a second variant and a third variant making it possible to define this mesh.

Thus, a surface element $S_{i,j}$ contained (or included) in the centered convolution support $\Omega_j$ has been associated with each first coordinate $r_i$. Each initial surface element $S_i$ extending beyond the periphery of the centered convolution support $\Omega_j$ is truncated so as to constitute a surface element $S_{i,j}$ delimited by the centered convolution support $\Omega_j$. It is then possible to determine the area of each surface element $S_{i,j}$, from which a weighting factor $\partial_{i,j}$ is defined, corresponding to the pair first coordinate $r_i$—second coordinate $u_j$. This weighting factor $\partial_{i,j}$ can for example be equal to the area of the surface element $S_{i,j}$ with which it is associated.

This embodiment amounts to redefining, at each second coordinate $u_j$, the mesh in the centered convolution support $\Omega_j$, in such a way as to associate, with each first coordinate $r_i$, a surface element $S_{i,j}$ delimited by said centered convolution support $\Omega_j$, and included in the latter. Stated otherwise, in the course of this variant, the method comprises an adaptation of the initial mesh to each centered convolution support $\Omega_j$, such that
- the surface elements $S_i$ of the initial mesh not extending beyond the support $\Omega_j$ are preserved;
- the surface elements $S_i$ of the initial mesh extending beyond the support $\Omega_j$ are truncated, so as to be delimited by said support.

The value of the convolution product, at the second coordinate $u_j$, is then computed according to the expression (2):

$$f * g(u_j) = \Sigma_{r_i \in \Omega_j} f(r_i) g(u_j - r_i) \partial_{i,j} \quad (2).$$

According to the prior art, this value is determined according to the expression (1'):

$$f * g(u_j) = \sum_{r_i \in \Omega_j} f(r_i) g(u_j - r_i) \frac{1}{c(r_i)}. \quad (1)'$$

In the prior art, the weighting term $$\frac{1}{c(r_i)}$$

associated with a first coordinate $r_i$ is independent of the second coordinate $u_j$, while according to the invention, this term depends on the mesh which is redefined in each centered convolution support $\Omega_j$. However, the mesh described in conjunction with this variant presents a drawback related to the fact that a centered convolution support $\Omega_j$ can comprise surface elements, arising from the initial mesh, that are associated with first coordinates $r_i$ that are not included in this centered convolution support. Such a surface element $S_{i'}$ is represented, in FIG. 3H, according to a dotted texture. Such a surface element is not taken into account in the computation of the convolution product, because the first coordinate, with which it is associated, is not included in the convolution support $\Omega_j$. Consequently, between two different second coordinates $u_j$, the surface actually taken into account of the centered convolution support can fluctuate.

Another drawback of this variant is a certain dependency in relation to the initial mesh. Indeed, certain measurement points $r_i$ can be eliminated, and those which remain may optionally be supplemented with other measurement points. Indeed, in certain applications, the set of measurements $f(r_i)$ can be partially updated by eliminating a subset of points $(r_i)$ and adding other points. This means that the list of the first coordinates $r_i$ is liable to evolve. Using as a basis an initial mesh makes it necessary to adjust this initial mesh when eliminating a measurement point, or when adding a measurement point. This adjustment can be costly in terms of time.

Figure 3I:
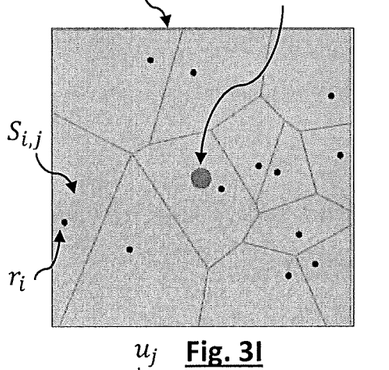

A more rigorous approach is described hereinbelow, in conjunction with a second variant 142, according to which each centered convolution support $\Omega_j$ forms the subject of a meshing independent of any previous meshing. This variant is illustrated in FIG. 3I. To each first coordinate $r_i$ included in the support $\Omega_j$ there corresponds a surface element $S_{i,j}$. Such a meshing can be a Vorondï meshing carried out not on the whole of the starting space, in the manner of the initial meshing mentioned previously, but limited to said centered convolution support $\Omega_j$ and bounded by the latter.

Stated otherwise, in the course of this variant, the meshing of the starting space is carried out, on each centered convolution support, in such a way as to define elements of the surfaces $S_{i,j}$, forming a partition of the centered convolution support $\Omega_j$, and not extending beyond the latter. The meshing of a centered convolution support is then carried out independently of the meshing of the other centered convolution supports. In a manner analogous to the previously described variant, it is then possible to determine the area of each surface element $S_{i,j}$, from which a weighting factor $\partial_{i,j}$ is defined, corresponding to the pair first coordinate $r_i$—second coordinate $u_j$. This weighting factor can for example be equal to the area of the surface element $S_{i,j}$ with which it is associated. Consequently, between two different second coordinates $u_j$, the convolution support $\Omega_j$ surface taken into account in the computation of the convolution product is identical.

An advantage of this variant is that the meshing of each convolution support is performed independently. The respective meshes of two centered interpolation supports $\Omega_j$ that do not overlap do not mutually influence one another.

Hence, when adding or deleting a measurement point of first coordinate $r_i$, the respective meshes of the centered convolution supports $\Omega_{j, r_i \notin \Omega_j}$ not containing the added or deleted point can be preserved. Adding or deleting a measurement point $r_i$ therefore involves only redefining the mesh of the few centered convolution supports $\Omega_{j, r_i \in \Omega_j}$ containing this point. The weighting factors $\partial_{i,j}$ are recomputed only for the centered convolution supports $\Omega_{j, r_i \in \Omega_j}$ containing the measurement points $r_i$ added or deleted, the weighting factors $\partial_{i,j}$ associated with the other supports $\Omega_{j, r_i \notin \Omega_j}$ being able to be preserved, with the proviso that the convolution kernel g, its support $\Omega$ or the second coordinates $u_j$ are also preserved. Thus, when adding or deleting a measurement point, only the centered convolution supports $\Omega_{j, r_i \in \Omega_j}$ containing said point form the subject of a redefining of their mesh. It is understood that the impact of a modification of the measurement points is limited solely to the centered convolution supports containing the modified points, thereby making it possible to reduce the computation time necessary for determining the weighting factors $\partial_{i,j}$ related to each surface element $S_{i,j}$. The method thus allows good adaptation of the mesh of the starting space to an evolution of the first coordinates $r_i$.

Figure 3J:
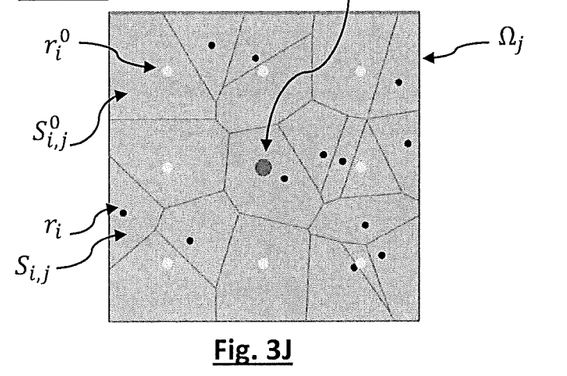

According to a third variant 143, represented in FIG. 3J, first so-called particular coordinates $r_i^0$ at which the convolution kernel g exhibits particular properties, for example a zero value, are determined in the centered convolution support $\Omega_j$ considered. A meshing of the centered convolution support $\Omega_j$ is then carried out by associating so-called particular surface elements $S_{i,j}^0$ with said first particular coordinates $r_i^0$, in the same manner that surface elements $S_{i,j}$ are associated with the first coordinates $r_i$ at which the measurement function is defined. The meshing of the centered convolution support therefore takes account of these particular surface elements.

Subsequent to step 140, and whichever variants are involved, a mesh, specific to each centered elementary support, has been established in each centered convolution support $\Omega_2$, making it possible to associate with each of the first coordinates $r_i$ included in the centered convolution support, a surface element $S_{i,j}$ included in the centered convolution support and not extending outside the latter.

The following step 160 consists in establishing, at each surface element $S_{i,j}$ thus determined, a weighting factor $\partial_{i,j}$ intended to be used in the computation of $f*g(u_j)$ according to equation (2). It has already been indicated that this weighting factor $\partial_{i,j}$ depends on the area of the surface element $S_{i,j}$ with which it is associated. According to a first variant 161, the weighting factor $\partial_{i,j}$ corresponds to the area of the surface element $S_{i,j}$ with which it is associated.

According to a second variant 162, the weighting factor $\partial_{i,j}$ is obtained from the integral of the convolution kernel g over the surface element $S_{i,j}$ with which it is associated. Stated otherwise, $\partial_{i,j}$ is an estimation of $\int_{S_{i,j}} g(u_j-q)dq/g(u_j-r_i)$. The inventor believes that this variant constitutes a preferred variant, insofar as it takes into account the evolution of the convolution kernel g in each surface element $S_{i,j}$.

Figure 3K:
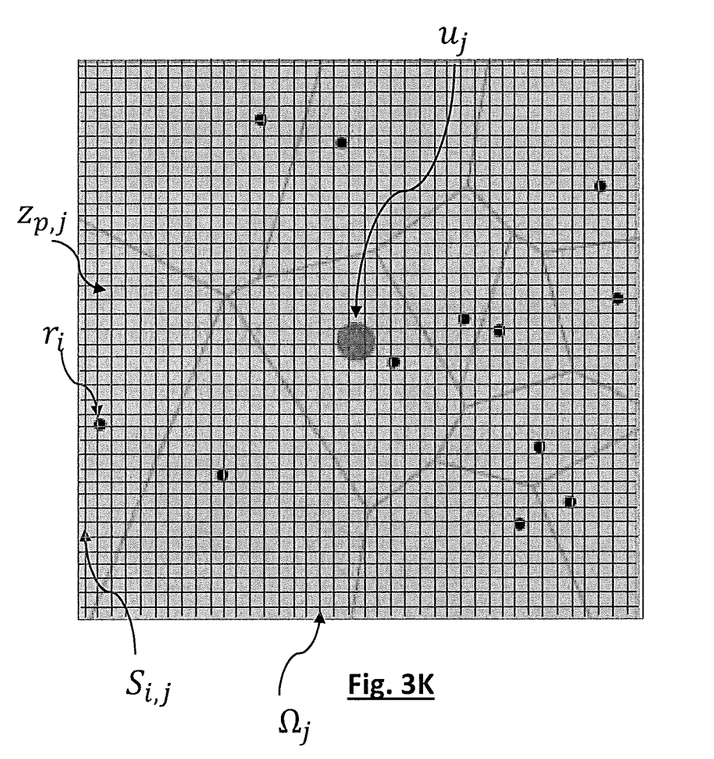
FIG. 3K represents a subdivision of a centered convolution support by elementary surfaces.

According to one embodiment, represented in FIG. 3K, during steps 161 and 162, the area of a surface element $S_{i,j}$ or the integral of the convolution kernel in this surface element, are computed by subdividing each centered convolution support into a plurality $P_j$ of elementary surfaces $z_{p,j}$, with $1 \leq p \leq P_j$. The computation of the weighting factor $\partial_{i,j}$ then comprises:

a summation of said elementary surfaces $z_{p,j}$ present in the surface element, thereby allowing an estimation of the area of the latter:

$$\partial_{i,j} = \Sigma_{z_{p,j} \in S_{i,j}} z_{p,j} \quad (3)$$

or a summation of said elementary surfaces $z_{p,j}$ present in the surface element, weighted by a value of said convolution kernel g in each elementary surface:

$$\partial_{i,j} = \frac{\sum_{z_{p,j} \in S_{i,j}} z_{p,j} \times g(z_{p,j})}{g(u_j - r_i)}.$$

Advantageously, the number $P_j$ of elementary surfaces $z_{p,j}$ constituting a centered convolution support $\Omega_j$ depends on the number of first coordinates $r_i$ included in said support. The higher this number, the bigger the number $P_j$, thereby correspondingly decreasing the size of these elementary surfaces. Conversely, when the centered convolution support $\Omega_j$ comprises few first coordinates $r_i$, for example at the periphery of a spiral formed in the space k, the number of elementary surfaces constituting each centered convolution support is smaller, and the size of these elementary surfaces is bigger. This makes it possible to optimize the computation time.

When two first coordinates $r_i$, $r'_i$ are situated in one and the same elementary surface $z_{p,j}$, they can be merged to constitute just a single coordinate, to which a mean value of the measurement function $f(r_i)$, $f(r'_i)$ of each merged coordinate is allocated. The subdivision of each centered elementary support $\Omega_j$ may not be uniform and be adapted to the evolution of the value of the kernel $g(z_{p,j})$ in said centered elementary support. The subdivision can be finer in the parts of the elementary support in which the kernel undergoes a fast evolution, the elementary surfaces $z_{p,j}$ then being smaller than in other parts of the support, in which the evolution of the value of the kernel is slower.

The subdivision of each centered elementary support $\Omega_j$ can also depend on the distance between two adjacent first coordinates $r_i$, $r'_i$, belonging to this support. The closer together these first coordinates, the finer the subdivision, the elementary surfaces $z_{p,j}$ being smaller than in other parts of the support.

The following step 180 consists in determining a value of the convolution product $f*g$ at each coordinate $u_j$ considered, by applying the expression (2).

Steps 120 to 180 are repeated for the set of second coordinates $u_j$, so as to obtain a value of the convolution product $f*g(u_j)$ at each of these coordinates.

The convolution product $f*g$ has thus been determined according to a uniform mesh, and this may constitute a prior step to the computation of a fast Fourier transform. This constitutes step 200:

$$F(x_j) = FFT[f*g(u_j)], \quad (4)$$

where $x_j$ designates a coordinate in a so-called arrival space, and FFT designates the "fast Fourier transform" operator. In this example, where the starting space is a frequency space (spatial frequencies), the arrival space is a space representing spatial coordinates, or direct space.

This step can comprise a normalization by the Fourier transform of the convolution kernel, such a normalization frequently being designated by the term de-apodization. This Fourier transform of the convolution kernel can be evaluated at $x_j$ by an analytical expression for this Fourier transform, or by fast numerical Fourier transform (FFT) of samples of g according to the second coordinates $u_j$:

$$F(x_j) = \frac{FFT[f * g(u_j)]}{FFT[g(u_j)]}. \quad (4')$$

The method described hereinabove can be implemented by an electronic computer, for example a microprocessor 20 represented in FIG. 1A, receiving measured data 15 from a detector 10. The microprocessor is advantageously linked to a storage unit 26 and/or to a display unit 24, allowing display of the computed data, whether this be

- the measurement function $f(r_i)$, representing data measured at each first coordinate $r_i$;
- the convolution products computed at each second coordinate $f*g(u_j)$;
- the function $F(x_j)$ obtained in the arrival space.

According to an advantageous embodiment, the microprocessor comprises several elementary microprocessors 21, able to carry out computation operations in parallel, preferably simultaneously. The method described hereinabove can then be implemented by various elementary microprocessors, each microprocessor carrying out, for example, all or part of steps 100 to 200 previously described for one or more second coordinates $u_j$.

First Example

A series of numerical simulations has been carried out, based on the frequency model of the Shepp-Logan phantom. This phantom is a representation of the human brain revealing the ventricles, the skull, and various contrasted zones. On the basis of an analytical expression for the frequency representation of the Shepp Logan phantom, measurements distributed in a non-uniform manner in a space k have been simulated, and then the method previously described has been applied, according to the second variant 142, so as to estimate the product of convolution of each measurement with a convolution kernel, the latter being a sinc function truncated at the third zero. The estimation of the convolution product is obtained according to a uniform matrix of 256*256 second coordinates $u_j$ in the space k. The convolution kernel extends over 8 intervals of adjacent second coordinates $u_j$ in each dimension of the space k.

Figure 4A:
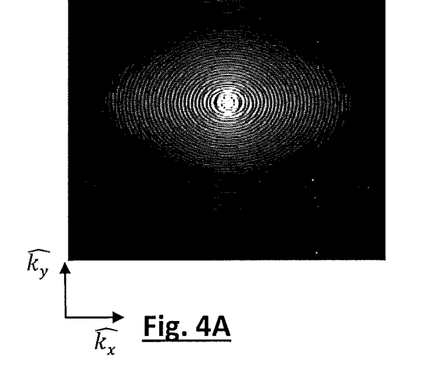
FIG. 4A represents the result of a product of convolution of a measurement function with a convolution kernel, in a space k, this product being computed according to a uniform meshing of this space. In this example, the measurement function is obtained for various irregularly distributed measurement points, by a simulation of an MRI acquisition sequence.

FIG. 4A represents an estimation of the convolution product according to said uniform matrix. The origin of the space k corresponds to the center of the image and this space is spanned by two orthogonal vectors $\vec{k_x}$ and $\vec{k_y}$.

Figure 4B:
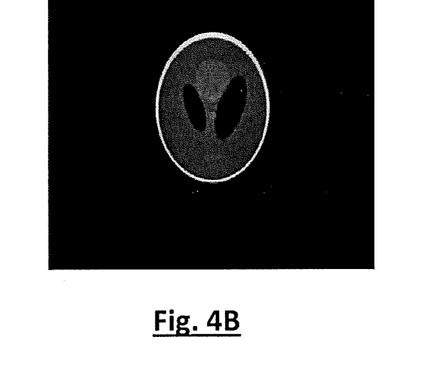
FIG. 4B is a representation of a fast Fourier transform of the convolution product illustrated in FIG. 4A. It represents a spatial distribution of the nuclear magnetization in an examined object, in this instance a brain model.

FIG. 4B represents an image obtained after applying a fast Fourier transform of the convolution product computed at each second coordinate. The central zone of the image, extending over 128*128 pixels around the center of the image, corresponds to a representation of the Shepp Logan phantom.

Second and Third Examples

Figure 5A:
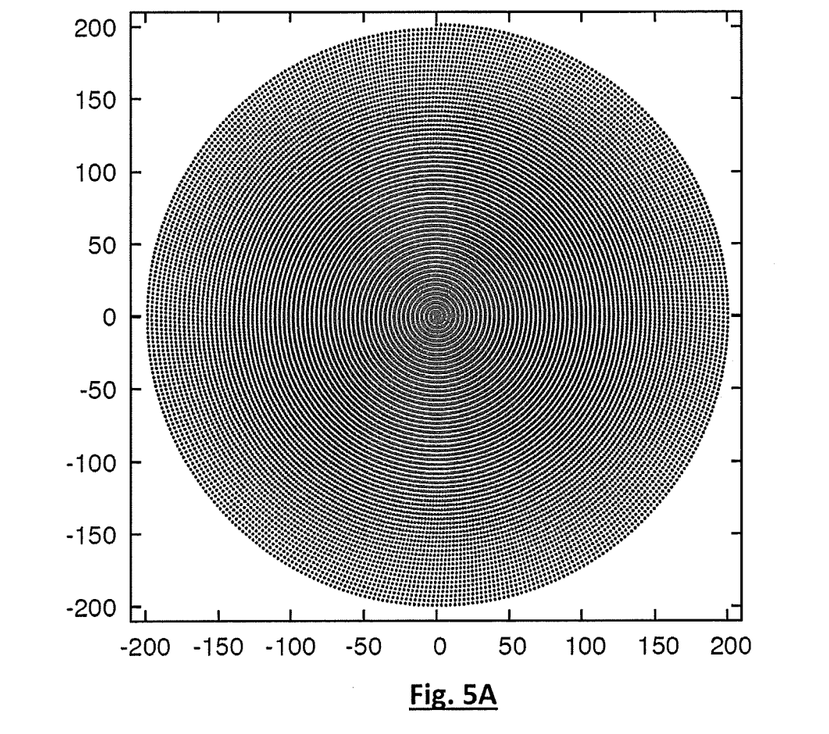
FIG. 5A represents a spiral along which measurements are distributed, according to a second example and according to a third example.

FIG. 5A represents points sampled according to a spiral, each point of this spiral represents a first coordinate $r_i$ at which a measurement function $f(r_i)$ is defined. The measurement function $f$ corresponds to the frequency model of the Shepp Logan phantom on each point $r_i$ of the spiral. According to a second example and a third example, a convolution product $f*g(u_j)$ has been determined, according to regular coordinates $u_j$, respectively without implementing the invention and by implementing the invention. The regular coordinates $u_j$ correspond to integer coordinates of the reference frame represented in FIG. 5A. The convolution kernel g is a seperable Kaiser Bessel function of width 4 and exhibiting a factor β equal to 8.996 along each of the axes. The support of the centered convolution kernel $\Omega_j$ extending over 4 integer coordinates along each axis.

In the second example, the convolution product has been computed according to the expression (1') described previously:

$$f * g(u_j) = \sum_{r_i \in \Omega_j} \frac{f(r_i)g(u_j - r_i)}{c(r_i)} \text{ with } \frac{1}{c(r_i)} \approx \delta(r_i)$$

the weighting factor corresponding to the coordinate $r_i$ being the area of the surface element $S_i$ arising from the Vorondï meshing. This example is based on a single Vorondï meshing of the starting space, the weighting factor $\delta(r_i)$ associated with a first coordinate $r_i$ being independent of the second coordinate $u_j$.

Figure 5B:
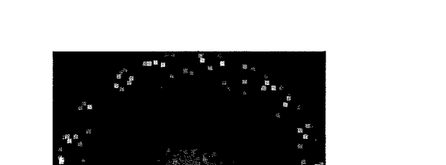
FIGS. 5B, 5C, 5D and 5E are results arising from the second example, representative of the prior art.
Figure 5C:
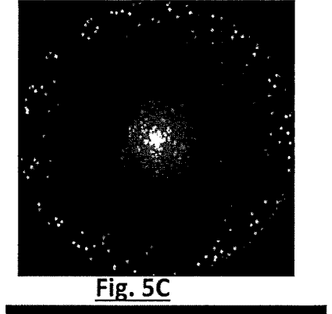
Figure 5D:
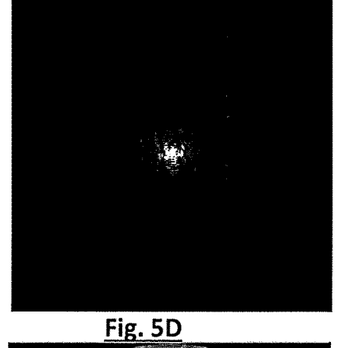

FIGS. 5B, 5C, 5D represent respectively, for each coordinate $u_j$:

$\Sigma_{r_i \in \Omega_j} \partial_i$ $\Sigma_{r_i \in \Omega_j} g(u_j - r_i) \partial_i$ $\Sigma_{r_i \in \Omega_j} f(r_i) g(u_j - r_i) \partial_i$.

Figure 5E:
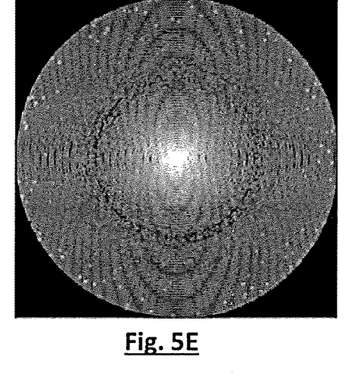

FIG. 5E corresponds to FIG. 5D, the gray levels being represented according to a logarithmic scale.

Figure 5F:
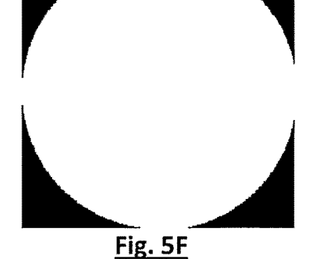
Figure 5G:
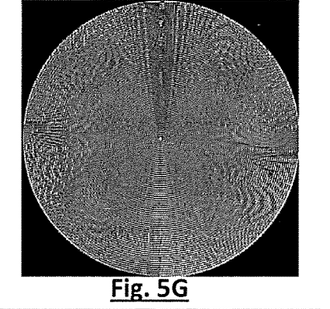

In the third example, the convolution product has been computed according to the expression (2), according to the second variant, described previously, of the method according to the invention. According to this embodiment, each centered elementary convolution support $\Omega_j$ forms the subject of its own specific meshing, in such a way that weighting factor $\partial_{i,j}$ associated with each first coordinate $r_i$ varies as a function of the elementary surface $S_{i,j}$ associated with said first coordinate, in the convolution support $\Omega_j$ centered on the second coordinate $u_j$. FIGS. 5F, 5G, 5H represent respectively, for each coordinate $u_j$:

$\Sigma_{r_i \in \Omega_j} \partial_{i,j}$ $\Sigma_{r_i \in \Omega_j} g(u_j - r_i) \partial_{i,j}$ $\Sigma_{r_i \in \Omega_j} f(r_i) g(u_j - r_i) \partial_{i,j}$.

FIG. 5J corresponds to FIG. 5H, the gray levels being represented according to a logarithmic scale.

FIGS. 5B and 5F show respectively, for each coordinate $u_j$, the sum of the weighting factors taken into account in each centered convolution support $\Omega_j$ without and with implementation of the invention. Here this is the sum of the elementary surfaces ($S_i$ in the second example and $S_{i,j}$ in the third example) taken into account when computing each convolution product. It is observed that according to the invention (FIG. 5F), this surface can be considered to be constant (mean of 16.3 and standard deviation of 0.014), while it fluctuates when the invention is not implemented (FIG. 5B: mean of 50.11—standard deviation of 156). The fact that the mean is equal to 16.3 and not to 16 stems from the fact that the meshing of each surface element is carried out while admitting a slight margin extending beyond the support of the convolution kernel, so as to take account of first coordinates disposed at the boundary of the support of the convolution kernel.

FIGS. 5C and 5G show respectively the sum of the weighting factors taken into account in each centered convolution support $\Omega_j$, multiplied by the values of the convolution kernel at the second coordinate $u_j$ referenced to each first coordinate $r_i$ of the centered convolution support $\Omega_j$, without and with implementation of the invention. The values can be considered to be stable when the invention is implemented (FIG. 5G), the mean being 2.96 with a standard deviation of 0.87. On the other hand, the results fluctuate greatly without implementation of the invention (FIG. 5C: mean of 8.5—standard deviation 30.8).

FIGS. 5D and 5H represent respectively the convolution products computed, at each second coordinate $u_j$, without and with implementation of the invention. It is observed that FIG. 5H comprises more utilizable information, notably at high spatial frequencies, thus making it possible to obtain a reconstruction of better quality. FIG. 5E also appears noisier than FIG. 5I. However, it is on the basis of such convolution products that a Fourier transform is applied so as to obtain a representation of the image in the direct space. Obtaining an image exhibiting less noise also allows a reconstruction of better quality.

In the above exemplary embodiments, the method is applied to measurements $f(r_i)$ distributed non-uniformly in a frequency space. It makes it possible to obtain a representation of the measurements, in an arrival space, in the spatial domain, by applying a Fourier transform. The person skilled in the art will understand that the method can be applied when the starting space corresponds to the spatial (or temporal) domain, the arrival space being a frequency space.

Moreover, in these exemplary embodiments, the first coordinates $r_i$ are distributed non-uniformly, while the second coordinates $u_j$ are distributed according to a uniform Cartesian grid. These conditions correspond to the particular case of the processing of data $f(r_i)$ acquired by an acquisition sequence of MRI type. But the invention can be applied when one wishes to estimate the value of a convolution product $f*g$ of a function $f(r_i)$, representing measurements, and determined according to first coordinates $r_i$, said value being estimated at second coordinates $u_j$ different from said first coordinates $r_i$. The first coordinates $r_i$ and/or the second coordinates $u_j$ can be distributed uniformly or non-uniformly.

An exemplary application is a reciprocal operation to that described in conjunction with the previous example, according to which values are available, at first coordinates $x_j$ of a starting space representing the spatial domain, of a function $F(x_j)$ representing measurements. This function is for example a representation of a sectional cut of an object, such as that described in conjunction with FIG. 4B. The objective is then to obtain an estimation of measurements, corresponding to this function $F(x_j)$, in a frequency space, according to first coordinates $r_i$, distributed in a non-uniform manner, described previously.

Accordingly, the following steps are undertaken:
normalization by the Fourier transform of the convolution kernel;
computation of a fast Fourier transform of the function $F(x_j)$, thereby making it possible to estimate a measurement function $f(u_j)$ in the frequency space, according to first $u_j$ defining a uniform Cartesian grid in this frequency space;
application of the method such as described previously, so as to estimate a convolution product $f*g(r_i)$ at the second coordinates which are non-uniformly distributed.

Beyond the applications in the processing of data acquired by MRI, the invention will be able to be applied to physical data measured with the aid of detectors, these data representing physical quantities, particularly electromagnetic waves, a magnetic field, an electrical signal, acoustic waves.

The invention claimed is:

1. A Method for generating an image by processing a measurement function ($f$), the measurement function being representative of measurements acquired by a detector, the measurement function being defined in a starting space, according to first coordinates ($r_i$), the method including the estimation, at second coordinates ($u_j$) of said starting space, of a value of a product of convolution ($f*g$) of the measurement function ($f$) with a convolution kernel (g), defined on a support, called the convolution support ($\Omega$), the method comprising:
acquiring measurements by a detector;
establishing the measurement function ($f$), according to first coordinates ($r_i$) of the starting space on the basis of the measurements (15) arising from the detector; and
defining second coordinates in the starting space ($u_j$),
wherein the method further comprises, for each second coordinate ($u_j$):
a) on the basis of the convolution support ($\Omega$), defining a centered convolution support ($\Omega_j$), associated with said second coordinate ($u_j$), in such a way that said second coordinate ($u_j$) constitutes the center of said centered convolution support ($\Omega_j$);
b) defining a mesh of said centered convolution support ($\Omega_j$), to associate a surface element ($S_{i,j}$) with each first coordinate ($r_i$) included in said centered convolution support ($\Omega_j$);
c) determining a weighting factor ($\partial_{i,j}$) associated with each first coordinate ($r_i$) included in said centered convolution support ($\Omega_j$);
d) computing a product of convolution of said measurement function ($f$) with said kernel (g) according to said centered convolution support ($\Omega_j$), by weighting a value $f(r_i)$ of the measurement function, at each first coordinate ($r_i$) included in said centered convolution support ($\Omega_j$), with the weighting factor ($\partial_{i,j}$) associated with said first coordinate ($r_i$), determined during step c);
e) estimating a value of said convolution product (f*g($u_j$)) at said second coordinate ($u_j$) as a function of the computation carried out during step d);
wherein steps a) to e) are implemented, for each second coordinate ($u_j$), by at least one microprocessor;
wherein during step b), the mesh is defined in such a way that each surface element ($S_{i,j}$) is contained in said centered convolution support ($\Omega_j$) and in such a way that the weighting factor ($\partial_{i,j}$) associated with one and the same first coordinate ($r_i$) varies as a function of the second coordinate ($u_j$), and
wherein the method further comprises performing an inverse Fourier Transform or a Fourier Transform on the estimated values of said convolution product at the second coordinates and generating an image representing measurements based on an output of the inverse Fourier Transform or based on an output of the Fourier Transform.

2. The method according to claim 1, in which during step d), the convolution product comprises a sum of the products:
of a value $f(r_i)$ of the measurement function at a first coordinate ($r_i$),
of a value ($g(u_j-r_i)$) of the convolution kernel at said first coordinate referenced to the second coordinate, and
of the weighting factor ($\partial_{i,j}$) determined during step c), the latter being associated with said first coordinate ($r_i$) and with said second coordinate ($u_j$), and wherein said products are computed for each first coordinate ($r_i$) included in the centered convolution support ($\Omega_j$) associated with a second coordinate ($u_j$).

3. The Method according to claim 1, further comprising, prior to steps a) to e), establishing an initial mesh of the starting space, to associate, with each first coordinate ($r_i$), an initial surface element ($S_i$), and in which during at least one step b), each surface element ($S_{i,j}$) associated with a first coordinate ($r_i$) is determined by truncating said initial mesh by said centered convolution support ($\Omega_j$), so that each initial surface element ($S_i$) extending beyond said centered convolution support is modified to be delimited by said centered convolution support.

4. The Method according to claim 1, further comprising during at least one step b), meshing said centered convolution support is such that at least one surface element ($S_{i,j}$) is defined independently of any initial mesh.

5. The Method according to claim 4, wherein said step b) further comprises:
   determining, in said centered convolution support ($\Omega_j$), first particular coordinates ($r_i^0$) at which the convolution kernel (g) takes a particular value; and
   defining particular surface elements ($S_{i,j}^0$) associated with the first particular coordinates.

6. The Method according to claim 1, wherein during step c), the weighting factor ($\partial_{i,j}$) associated with each first coordinate ($r_i$) is determined by computing an area of the surface element ($S_{i,j}$) associated with said first coordinate ($r_i$), defined during step b).

7. The Method according to claim 1, wherein during step c), the weighting factor ($\partial_{i,j}$) associated with each coordinate ($r_i$) is determined by computing an integral of the convolution kernel (g) over the surface element area ($S_{i,j}$) associated with said first coordinate ($r_i$).

8. The Method according to claim 1, wherein during step c), each centered convolution support ($\Omega_j$) is subdivided into a plurality of elementary surfaces ($z_{p,j}$), the computation of the weighting factor ($\partial_{i,j}$) associated with each first coordinate ($r_i$) comprising a sum of the elementary surfaces ($z_{p,j}$) included in the surface element ($S_{i,j}$) associated with said first coordinate ($r_i$), said sum being optionally weighted by a value of said convolution kernel (g), in each of said elementary surfaces.

9. The Method according to claim 8, wherein the number ($P_j$) of elementary surfaces ($z_{p,j}$) in a centered convolution support ($\Omega_j$) is determined as a function:
   of the number of first coordinates ($r_i$) included in said centered convolution support ($\Omega_j$), or
   of the distance between two first adjacent coordinates ($r_i$, $r'_i$) belonging to said centered convolution support, or
   of the evolution of the convolution kernel (g) in said centered convolution support.

10. The Method according to claim 1, wherein each second coordinate ($u_j$) defines a uniform mesh of the starting space.

11. The Method according to claim 1, wherein the starting space is a frequency space or a spatial space or a temporal space.

12. The Method according to claim 1, wherein said microprocessor comprises a plurality of elementary microprocessors, and wherein steps a) to e) are implemented simultaneously by various elementary microprocessors, each elementary microprocessor performing steps a) to e) for one or more second coordinates ($u_j$).

13. The Method according to claim 1, wherein the convolution kernel (g) is:
   a symmetric function with respect to the center of its support ($\Omega$), and/or
   a function whose value is at a maximum at the center of its support ($\Omega$).

14. The Method according to claim 1, wherein the measurements, on a basis of which the measurement function ($f$) is established, are acquired by a detector of electromagnetic waves of a magnetic resonance imaging (MRI) system.

15. The method according to claim 1, wherein the convolution products result in uniformly distributed data in a temporal frequency or spatial frequency domain, the inverse Fourier Transform used in an estimation of the measurements in a temporal or spatial domain, or
   the convolution products result in uniformly distributed data in the temporal or spatial domain, the Fourier Transform used in an estimation of the measurements in the temporal frequency or spatial frequency domain.

16. A Method for estimating a Fourier transform of a measurement function ($f$) representative of measurements acquired by a detector, and defined in a starting space, according to first discrete coordinates ($r_i$), said method comprising:
   estimating a product of convolution ($f*g$) of said measurement function ($f$), with a convolution kernel (g), according to a method according to claim 1, at second discrete coordinates ($u_j$), the latter defining a regular mesh of the starting space;
   applying, in the inverse Fourier Transform or the Fourier Transform, a fast Fourier transform to said estimated convolution product ($f*g$) at said second discrete coordinates ($u_j$).

17. A non-transitory computer readable recording medium comprising instructions for the execution of steps a) to e) of the method according to claim 1 by a microprocessor.

* * * * *